(12) United States Patent
Watts et al.

(10) Patent No.: US 7,952,182 B2
(45) Date of Patent: May 31, 2011

(54) SEMICONDUCTOR DEVICE WITH PACKAGE TO PACKAGE CONNECTION

(75) Inventors: Nicholas Randolph Watts, Phoenix, AZ (US); Javier Soto Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 12/165,315

(22) Filed: Jun. 30, 2008

(65) Prior Publication Data

US 2009/0321906 A1    Dec. 31, 2009

(51) Int. Cl.
*H01L 21/00* (2006.01)

(52) U.S. Cl. ........... 257/686; 438/121; 257/E23.001

(58) Field of Classification Search ............ 257/723, 257/724, 725, 686
See application file for complete search history.

(56) References Cited

U.S. PATENT DOCUMENTS

| 7,498,668 B2 * | 3/2009 | Kawabata et al. ........... 257/686 |
| 7,642,656 B2 * | 1/2010 | Yoo et al. ........................ 257/777 |
| 2004/0036164 A1 * | 2/2004 | Koike et al. .................... 257/723 |

* cited by examiner

*Primary Examiner* — Thao P. Le
(74) *Attorney, Agent, or Firm* — Blakely, Sokoloff, Taylor & Zafman LLP

(57) ABSTRACT

A semiconductor package comprises a first package; a second package that is provided on the first package; and a first interconnect that comprises a bump to couple to the first package and a base material layer to cover the bump, wherein the second package is supported on the base material layer that is coupled to the bump.

18 Claims, 4 Drawing Sheets

SEMICONDUCTOR DEVICE WITH PACKAGE TO PACKAGE CONNECTION

BACKGROUND

Some systems may comprise one or more semiconductor package. For example, a top semiconductor package may be stacked on a bottom semiconductor package. Solder balls may be used to electrically and mechanically couple the top semiconductor package to the bottom semiconductor package. To create space for the solder balls, bonding pads for the solder balls and/or solder resist opening, a size of the systems is increased.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
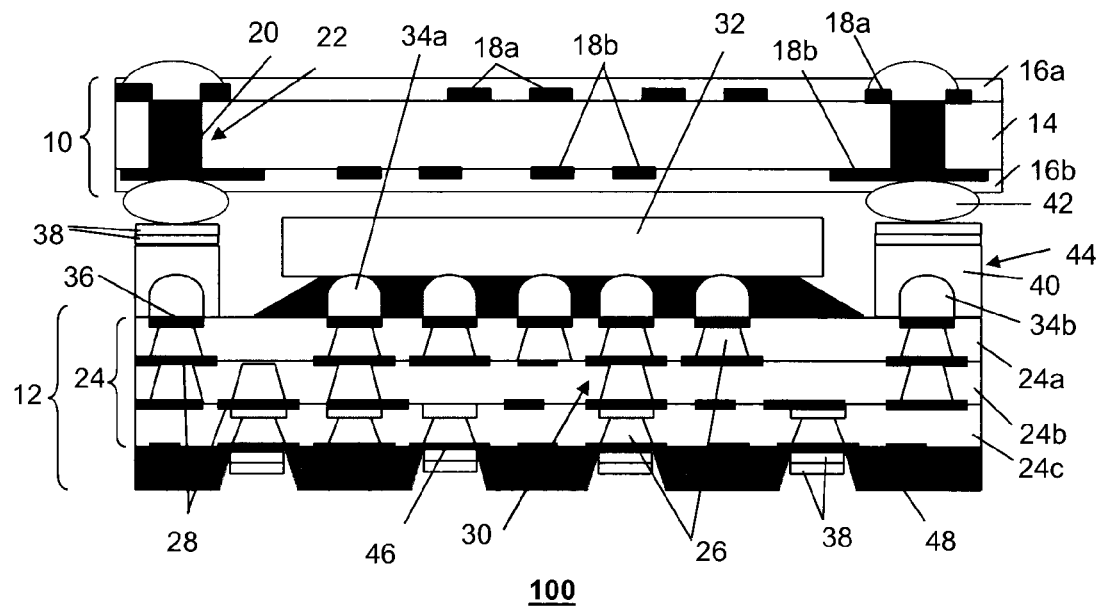
FIG. 1 is a schematic diagram of an embodiment of a system that may comprise an upper semiconductor package and a lower semiconductor package.

In the following detailed description, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The following description may include terms, such as upper, lower, top, bottom, first, second, etc. that are used for descriptive purposes only and are not to be construed as limiting.

FIG. 1 illustrates an embodiment of a system 100 that may be provided in a semiconductor package. The system 100 may comprise a bottom package 12 and a top package 10 that may be provided on the bottom package 12. In one embodiment, the top package 10 may comprise a first substrate 14, an upper die 16a and a lower die 16b. In one embodiment, the upper die 16a and the lower die 16b may be attached to the substrate 14. In another embodiment, the upper die 16a may comprise an upper trace 18a. The lower die 16b may comprise a lower trace 18b. An upper die 16a may be coupled to a lower die 16b by an upper conductive path 22 that may comprise an upper trace 18a, an upper plated through holes (PTH) 20 and a lower trace 18b.

The bottom package 12 may comprise a second substrate 24 that may comprise a first buildup layer 24a, a second buildup layer 24b and a third buildup layer 24c; however, in some embodiments, the second substrate 24 may have a different structure with more or fewer layers, or some embodiments may utilize a single layer substrate. In one embodiment, the bottom package 12 may comprise a coreless package; however, in some embodiment, the bottom package 12 may comprise at least one substrate layer. In one embodiment, a die 32 may be bonded to the second substrate 24 by a set of one or more die bonding bumps 34a. A die bonding bump 34a may be coupled to a lower conductive path 30 by an upper bonding pad 36 that may be provided on the second substrate 24.

One example of the first substrate 14 and/or the second substrate 24b may comprise a printed circuit board (PCB) or a printed wiring board (PWB); however, any other suitable substrate may be utilized, including flex substrates such as folded flex substrates or flexible polyimide tape, laminate substrates, buildup substrates, ceramic substrates, flame retardant (FR-4) substrate, or tape automated bonding (TAB) tape material. In another embodiment, the first buildup layer 24a, the second buildup layer 24b and/or the third buildup layer 24c may comprise, for example, a dielectric layer, an intermediate layer, or an insulating layer.

Referring to FIG. 1, in one embodiment, a lower conductive path 30 may comprise one or more vias 26 and one or more traces 28 that may be provided in the second substrate 24; however, in some embodiments, the lower conductive path 30 may be provided by any other interconnects, e.g., including PTHs, patterned metal layers, routings, or wirings, bond pads. In one embodiment, a via 26 may be filled with conductive material. The lower conductive path 30 may further comprise one or more lower bonding pad 46 that may be provided on a lower side of the second substrate 24 to bond to one or more external interconnects (not shown). For example, one or more solder balls (not shown) may be utilized for external interconnects. A surface layer 38 may be provided on the lower bonding pad 46. An example of the surface finish 38 may comprise Ni, Pd, Au or any other surface finish materials.

Referring to FIG. 1, in one embodiment, a set of one or more packaged-to-package interconnects 40 may be formed on the bottom package 12. A package-to-package interconnect 40 may support the top package 10 on the bottom package 12. In one embodiment, the interconnect 44 may bond the top package 10 to the bottom package 12 without a bonding pad. In one embodiment, a package-to-package interconnect 40 may be positioned to couple an upper conductive path 22 to a lower conductive path 30. In another embodiment, a package-to-package interconnect 40 may couple an upper conductive path 22 to a lower conductive path 30 by a solder layer 42. In another embodiment, a package-to-package interconnect 44 may be used to electrically and mechanically couple the top package 10 to the bottom package 12. In another embodiment, the set of package-to-package interconnects 44 may be positioned to surround the die 32 and/or the set of die bonding bumps 34a. For example, a package-to-package interconnect 44 may be formed on the second substrate 24 where a die 32 is absent.

In one embodiment, a package-to-package interconnect 44 may comprise a second bump 34b that may be coupled to a lower conductive path 30, and a base material layer 40 that may be provided to cover the second bump 34b. In one embodiment, the base material layer 40 may comprise a top surface to support the top package 10. In another embodiment, the base material layer 40 may be coupled to the second substrate 24 by the second bump 34b. A surface finish 38 may be provided on the package-to-package interconnect 44, e.g., on the base material layer 40. In one embodiment, the base material layer 40 may comprise Cu. For example, the base material layer 40 may be formed by a portion of a Cu base layer where a second bump 34b is formed. In yet another embodiment, a package-to-package interconnect 44 may have a pillar shape to support the top package 10 on the bottom package 12. In yet another embodiment, the set of package-to-package interconnect 44 may each have approximately the same thickness. In one embodiment, a ball grid array or solder ball may be used for an external interconnect for the package 100.

Figure 2A:
FIG. 2A-2G are schematic diagrams of an embodiment of a method that may be used to provide the system of FIG. 1.
Figure 2B:
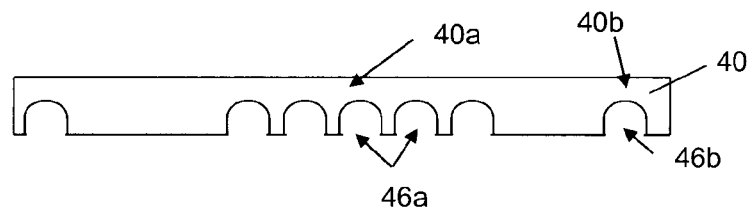

Referring to FIGS. 2A to 2G, an embodiment of a method that may be used to fabricate the system 100 of FIG. 1 will be described. Referring to FIG. 2A, a base material layer 40 may be prepared. In one embodiment, the base material layer 40 may comprise a Cu base layer. Referring to FIG. 2B, the base material layer 40 may be selectively etched to form a first set of one or more bump openings 46a and a second set of one or more bump openings 46b, e.g., at a lower side of the base material layer 40. In one embodiment, the first set of bump openings 46a may be used to form die bonding bumps 34a. The second set of bump openings 46b may be used to form second bumps 34b.

In one embodiment, the second set of bump openings 46b may be positioned to surround the first set of bump openings 46a. In another embodiment, the first set of bump openings 46a may be formed in a center portion 40a of the base material layer 40. The second set of bump openings 46b may be formed in a side portion 40b of the base material layer 40. In another embodiment, the second set of bump openings 46b may be positioned to match a location of an upper conductive path 22 and/or a corresponding lower conductive path 30. The first set of bump openings 46a may be positioned to match a location of the die 32.

Figure 2C:
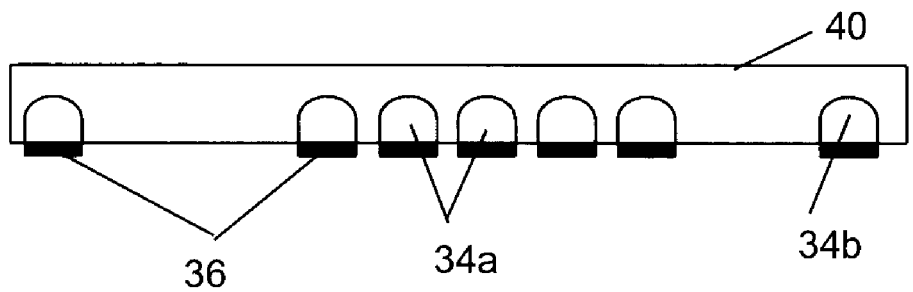
Figure 2D:
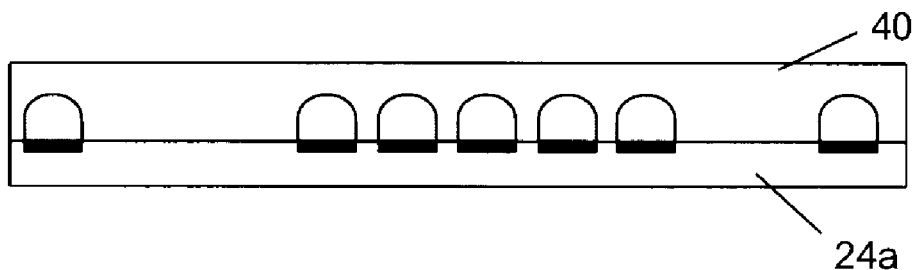

Referring to FIG. 2C, in one embodiment, a bump opening 46a may be plated or filled with conductive material to form a die bonding bump 34a. A bump opening 46b may be plated or filled with conductive material to form a second bump 34b. In another embodiment, an upper bonding pad 36 may be formed on a die bonding bump 34a and/or a second bump 34b. For example, plating or sputtering may be used to provide an upper bonding pad 36. Referring to FIG. 2D, a first buildup layer 24a may be attached to the lower side of the base material layer 40.

Figure 2E:
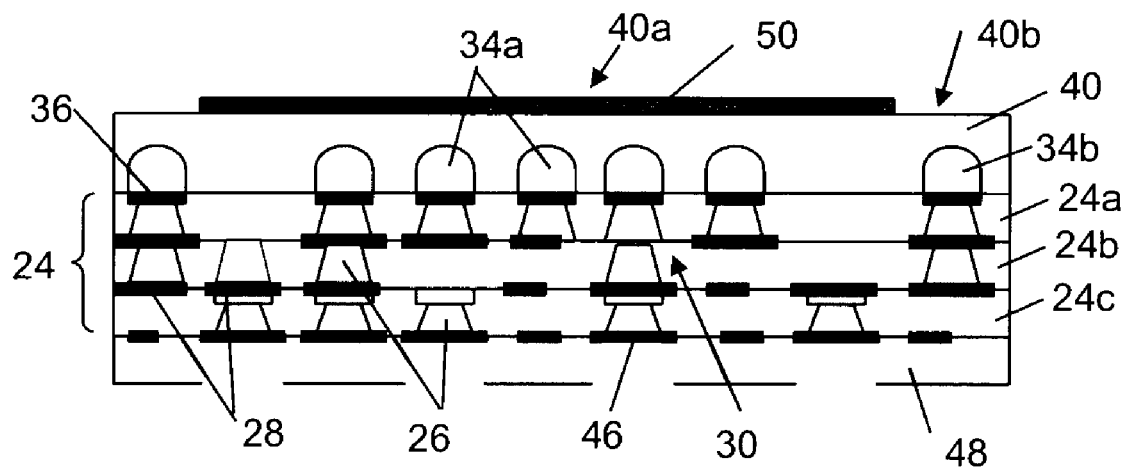

Referring to FIG. 2E, in one embodiment, a second buildup layer 24b and a third buildup layer 24c may be formed under the first buildup layer 24a to provide a second substrate 24.

One or more vias 26 may be formed in the second substrate 24, e.g., by laser (not shown). In one embodiment, a via 26 may be positioned to correspond to a die bonding bump 34a or a second bump 34b. In another embodiment, a via 26 may be positioned to correspond to a location of an upper bonding pad 36. In another embodiment, one or more traces 28 may be disposed in the second substrate 24. A via 26 and a trace 28 may be electrically coupled to provide a conductive path 30 that may couple to a die bonding bump 34a or a second bump 34b.

Referring to FIG. 2E, a bonding pad 46 may be provided on a lower side of the third buildup layer 24c to couple to an external interconnect (not shown). In one embodiment, a conductive path 30 may couple a die bonding bump 34a or a second bump 34b to a lower bonding pad 46. With reference to FIG. 2E, in one embodiment, an upper resist 50 may be provided on the base material layer 40. The upper resist 50 may be patterned to expose a side portion 40b of the base material layer 40 that may correspond to a second bump 34b. In one embodiment, the upper resist 50 may comprise a photoimageable solder resist (PSR). In another embodiment, the upper resist 50 may be patterned to cover the center portion 40a that may correspond to a die bonding bump 34a. A lower resist 48 may be provided on a lower side of the second buildup layer 24c. In one embodiment, the lower resist 48 may be patterned to expose a lower bonding pad 46. A surface finish 38 may be provided on the exposed side portion 40b and/or the exposed lower bonding pad 46.

Figure 2F:
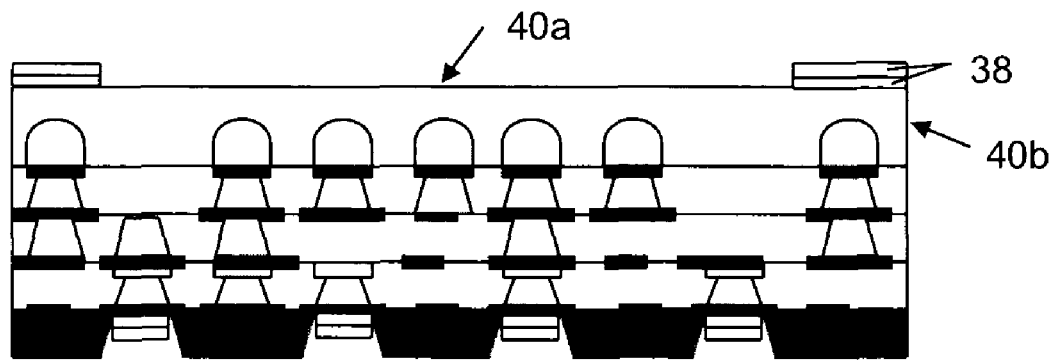
Figure 2G:
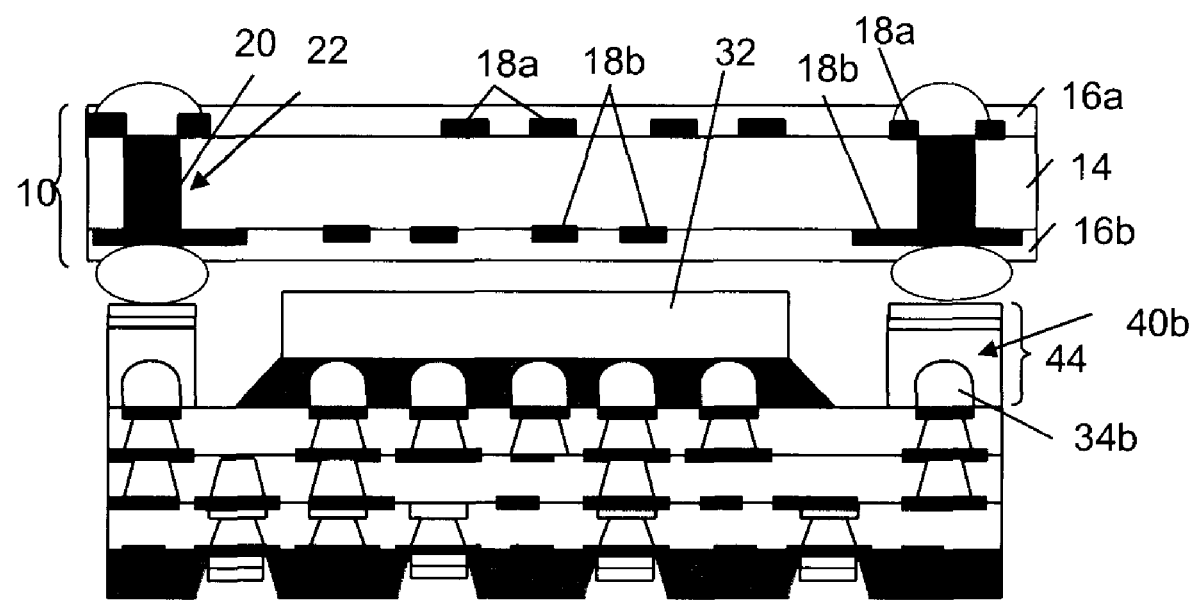

Referring to FIG. 2F, the upper resist 50 may be removed to expose a center portion 40a of the base material layer 40 that may correspond to a die bonding bump 34a. Referring to FIG. 2G, in one embodiment, the base material layer 40 may be selectively etched to remove the center portion 40a to expose the die bonding bumps 34a. In one embodiment, a surface finish 38 that covers a side portion 40b may be used to mask the side portion 40b. In another embodiment, the side portion 40b may be retained to provide a package-to-package interconnect 44 that may comprise a second bump 34b.

Referring to FIG. 2G, the package-to-package interconnects 44 may have an almost equal thickness. In another embodiment, the package-to-package interconnects 44 may have a flat top surface to support a top package 10 to be bonded to the bottom package 12. In another embodiment, a package-to-package interconnect 44 may have a thickness to support a top package 10 of FIG. 1 on the bottom package 12. In another embodiment, a package-to-package interconnect 44 may have a thickness to support an top package 10 that may not contact the die 32 attached to the lower package 12. In yet another embodiment, an upper die 16a and a lower die 16b may be provided on an upper substrate 14 to provide the top package 10. A set of one or more traces 18a and 18b may be formed in the upper die 16a and the lower die 16b. The upper die 16a may be coupled to the lower die 16b by an upper PTH 20 that may be formed in the upper substrate 14. A solder layer 42 may be used to bond a package-to-package interconnect 44 to an upper conductive path 22. An package-to-package interconnect 44 may electrically and mechanically couple the top package 10 to the bottom package 12 by the solder layer 42.

While FIG. 2A-2G are illustrated to comprise a sequence of processes, the method in some embodiments may perform illustrated processes in a different order.

Figure 3:
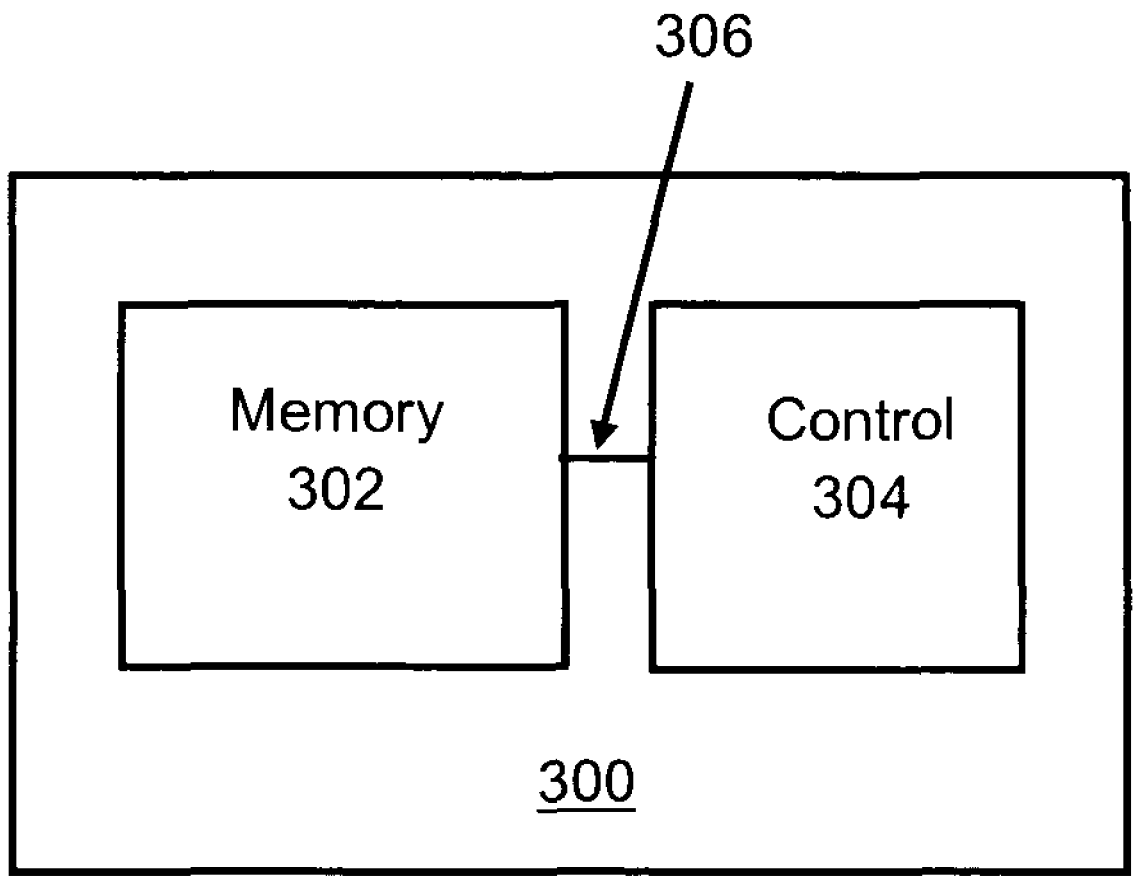
FIG. 3 is a schematic diagram of an embodiment of the present invention.

FIG. 3 illustrates an embodiment of a memory system 300 that may be formed in one package. In one embodiment, a universal serial bus (USB) flash memory or any other memories may be formed in one package. For example, the memory system 300 may be formed in a package 100. In one embodiment, the memory system 300 may comprise a control 304 that may be implemented as a die 32 of FIG. 1. For example, the control 32 may comprise a memory controller, a digital signal processor (DSP), a processor, logic circuit or any other control unit or device. The memory system 300 may comprise a memory 302 that may be coupled to the control 304. In one embodiment, the memory 302 may be implemented by the top package 10.

One or more interconnects 306 may couple the control 304 to the memory 302. The interconnects 306 may be made up of the substrate 14, 24, as well as one or more interconnects in the package 100 such as 26, 28, 36, 20, and 44. In one embodiment, the memory system 300 may be coupled to an external I/O (not shown). Although the embodiment of FIG. 3 is illustrated to use a memory 302, in some embodiments, other memory devices may be utilized, such as NOR, NAND, dynamic random access memory (DRAM), non-volatile memory devices. Again, in some embodiments, a different number of memory devices may be utilized. Furthermore, while FIG. 3 is illustrated to use die 32 as the control 304, in some embodiments, one or more other dies may be utilized.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A system, comprising:
 a first package;
 a second package that is provided on the first package; and
 a first interconnect that is to support the second package on the first package, wherein the first interconnect comprises a bump and a base material layer that are coupled to each other, the base material layer comprises a top surface to support the second package and a lower side that comprises a bump opening, the bump is provided in the bump opening, and a lower surface of the bump and a lower surface of the base material layer are provided on the first package, the bump is further to couple to the first package and a base material layer to cover the bump, wherein the second package is supported on the base material layer that is further coupled to the second package the bump.

2. The system of claim 1, wherein the base material layer has a pillar shape to support the second package on the first package.

3. The system of claim 1, wherein the base material layer comprises conductive material to couple the first package to the second package.

4. The system of claim 1, wherein the first package comprises a first conductive path that corresponds to a second conductive path in a second package, wherein the first interconnect is provided at a location that corresponds to at least one of the first conductive path and the second conductive path.

5. The system of claim 1, wherein the base material layer may have a flat top surface to support the second package.

6. The system of claim 1, wherein the first interconnect may bond the first package to the second package without a bonding pad.

7. The system of claim 1, wherein the first package comprises a substrate and a semiconductor die attached to the substrate, the first interconnect is located to surround the semiconductor die on a side portion of the first package.

8. An integrated circuit package, comprising:
 a bottom package;
 a top package that is coupled to the first provided on the bottom package;
 a base material layer that is provided on a top surface of the bottom package, wherein the base material layer is to support couple to the top package that is supported on a top side of the base material layer, a bump opening is provided on a lower side of the base material layer; and
 a first bump that is provided in the bump opening on a bottom side of the base material layer to couple to the base material layer, wherein the first bump is to couple to a bump pad on the bottom package at a lower surface of the first bump.

9. The integrated circuit package of claim 8, wherein the top package comprises a memory and the bottom comprises a control to the memory.

10. The integrated circuit package of claim 8, further comprising wherein the bottom package comprises:
 a second bump provided on the first package a first substrate, on which the bump pad is provided;
 a semiconductor die that is coupled to the substrate by a the first package by the second bump.

11. The integrated circuit package of claim 8, wherein the base material layer has a pillar shape that has a flat top side.

12. The integrated circuit package of claim 10, wherein the base material layer is position at a location where the second bump is absent.

13. The integrated circuit package of claim 10, wherein the base material layer is position at a location where the semiconductor die is absent.

14. The integrated circuit package of claim 8, wherein the base material layer comprises conductive material to electrically couple the top package to the bottom package.

15. The integrated circuit package of claim 10, wherein the first substrate comprises a plurality of buildup layers and a set of first conductive paths that is selectively couples to one of the first bump and the second bump.

16. The integrated circuit package of claim 10, wherein the set of first conductive path comprise one or more from a group comprising plated through holes, patterned metal layers, routings, wirings, and bond pads.

17. The integrated circuit package of claim 8, further comprising:
 a surface finish provided on the top side and a side portion of the base material layer, wherein the base material layer comprise a Cu base layer, the surface finish comprises one or more selected from a group comprising Ni, Pd, Au.

18. The integrated circuit package of claim 8, wherein the top package comprises:
 a second substrate;
 a top semiconductor die and a lower semiconductor die attached to a top side and a lower side of the substrate, respectively, wherein the top die and the lower die are coupled to each other by a second conductive path in the second substrate, the second conductive path is further to couple to the base material layer by a solder layer.

* * * * *